(12) United States Patent
McColloch (10) Patent No.: US 7,785,924 B2
(45) Date of Patent: Aug. 31, 2010

(54) METHOD FOR MAKING SEMICONDUCTOR CHIPS HAVING COATED PORTIONS

(75) Inventor: Laurence Ray McColloch, Santa Clara, CA (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 556 days.

(21) Appl. No.: 11/751,692

(22) Filed: May 22, 2007

(65) Prior Publication Data

US 2008/0290476 A1  Nov. 27, 2008

(51) Int. Cl.
*H01L 21/00* (2006.01)
(52) U.S. Cl. ............... 438/106; 438/109; 257/E23.187; 372/9
(58) Field of Classification Search .............. 438/106, 438/109; 372/9
See application file for complete search history.

(56) References Cited

U.S. PATENT DOCUMENTS

| | | | |
|---|---|---|---|
| 5,940,424 A | 8/1999 | Dietrich | |
| 6,026,557 A | 2/2000 | Freund | |
| 6,337,510 B1 * | 1/2002 | Chun-Jen et al. | ............ 257/666 |
| 6,346,155 B1 | 2/2002 | Fox, IV | |
| 6,396,864 B1 | 5/2002 | O'Brien | |
| 6,844,616 B2 * | 1/2005 | Liao et al. | .................. 257/676 |
| 2001/0050037 A1 | 12/2001 | Asazuma et al. | |
| 2005/0101039 A1 | 5/2005 | Chen et al. | |

* cited by examiner

*Primary Examiner*—Thao X Le
*Assistant Examiner*—Elias Ullah (57) ABSTRACT

A method for making semiconductor chips having coated portions can include mounting the chips in lead frames, stacking the lead frames in an orientation in which a portion of one lead frame masks a portion of a chip mounted on another lead frame but leaves another portion of the chip mounted on the other lead frame exposed to receive a coating, and depositing a coating on the stacked lead frames using, for example, an evaporative coating machine. In this manner, the coating is deposited on exposed portions of chips, such as its edges, and is not deposited on masked portions of chips, such as bond pads.

14 Claims, 8 Drawing Sheets

METHOD FOR MAKING SEMICONDUCTOR CHIPS HAVING COATED PORTIONS

TECHNICAL FIELD OF THE INVENTION

The invention relates to a method for producing semiconductor chips, such as edge-emitting lasers, having coated portions.

BACKGROUND OF THE INVENTION

Optical data transceivers for telecommunications and data communication networks include light sources, such as light-emitting diode (LED) and semiconductor laser chips. Although LEDs are economical, edge-emitting laser chips are popular for many reasons, including the capability of launching more optical power into an optical fiber than an LED or surface-emitting laser.

Figure 1:
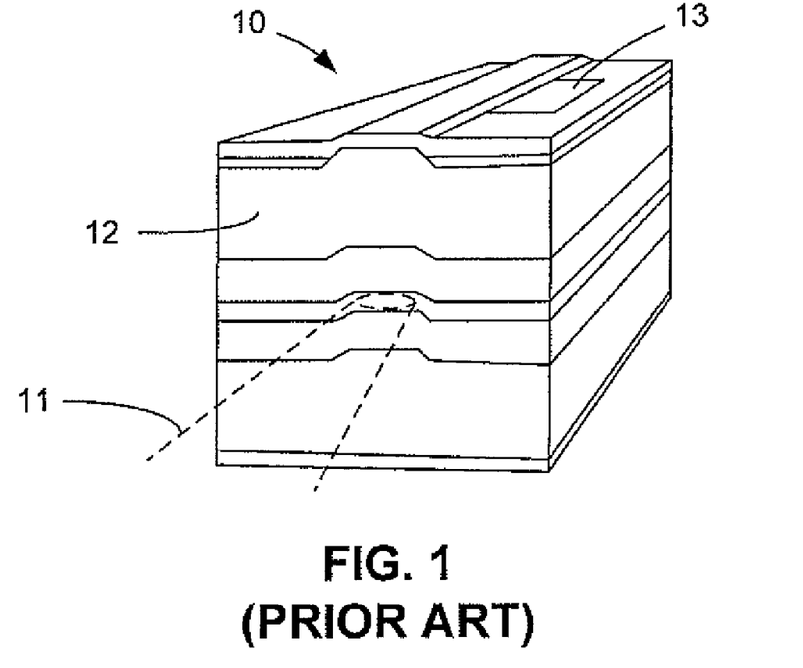
FIG. 1 is a perspective view of an edge-emitting laser chip in accordance with the prior art.
Figure 2:
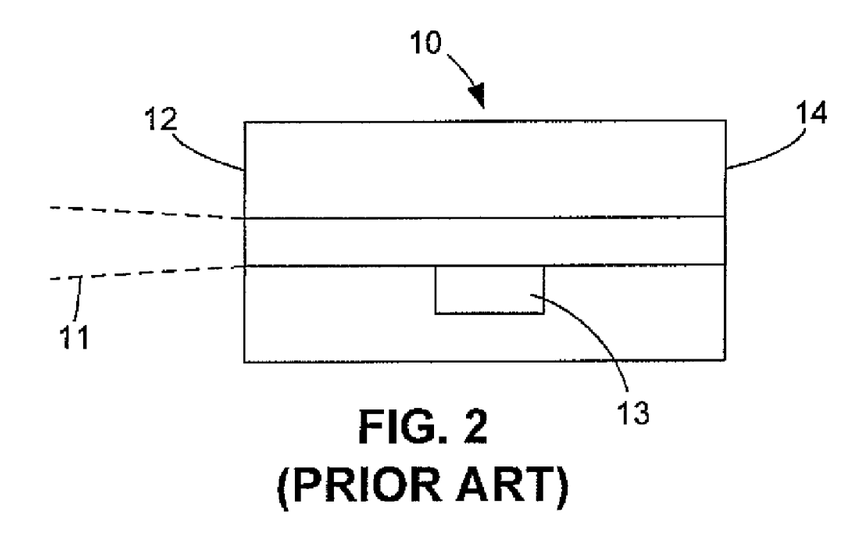
FIG. 2 is a top view of the chip shown in FIG. 1.

A conventional edge-emitting laser chip 10 (also referred to as a die) is illustrated in FIGS. 1-2. Such a chip 10 is typically cleaved from a wafer (not shown) on which it is formed with many other such chips, and then one or both optical facets 12 and 14, i.e., the edges of chip 10, are coated with reflective, hermetic or other optical coatings. (Chip 10 emits light 11 from one of the facets 12, and the other facet 14 is typically mirrored.) To coat the facets, a number of such chips are held in a fixture (not shown), which is then placed in an evaporative deposition machine. The machine deposits the coating on the exposed facets. After the coating deposition process is completed, the fixture is removed from the machine, and the chips are removed from the fixture. It is important that only the facets be coated, and that other portions of the chip, such as the bond pads 13 to which bond wires will be attached in a later manufacturing step, remain free of coating material. In such later manufacturing steps, the finished chip will typically be mounted on a lead frame (not shown) and bond wires attached between the bond pads 13 and the lead frame electrical contacts.

A typical fixture (not shown) has parallel opposing jaws that can be adjusted to clamp a stack of chips between them. The manner in which the chips are stacked in the fixture ensures that only the facets are exposed in the evaporative deposition machine; part of the fixture masks the bond pads and other portions of the chips from being coated.

It is important that the chips be handled carefully to avoid damaging them. A problem with a coating method that uses a clamping fixture is that clamping the chips in the fixture often damages some of them, reducing manufacturing yield. It would be desirable to provide a method for coating portions of semiconductor chips that minimizes the likelihood of damaging them. The present invention addresses these problems and deficiencies in the manner described below.

SUMMARY OF THE INVENTION

The present invention relates to a method for making semiconductor chips having coated portions, in which the chip are mounted on lead frames and the lead frames are stacked on one another, such that a portion of one lead frame masks a portion of a chip mounted on another lead frame but leaves another portion of the chip mounted on the other lead frame exposed so that it can receive a coating when placed in an evaporative coating machine or similar device. In other words, when the machine is operated with the lead frames holding the chips stacked in this manner, the coating is deposited on exposed portions of chips and is not deposited on masked portions of the chips. The exposed portions can be, for example, the facets or edges of edge-emitting laser chips, while the masked portions can be the bond pads of such chips.

These and other features and advantages of the invention will become apparent from the following description, drawings and claims.

DETAILED DESCRIPTION OF AN ILLUSTRATIVE EMBODIMENT

Figure 3:
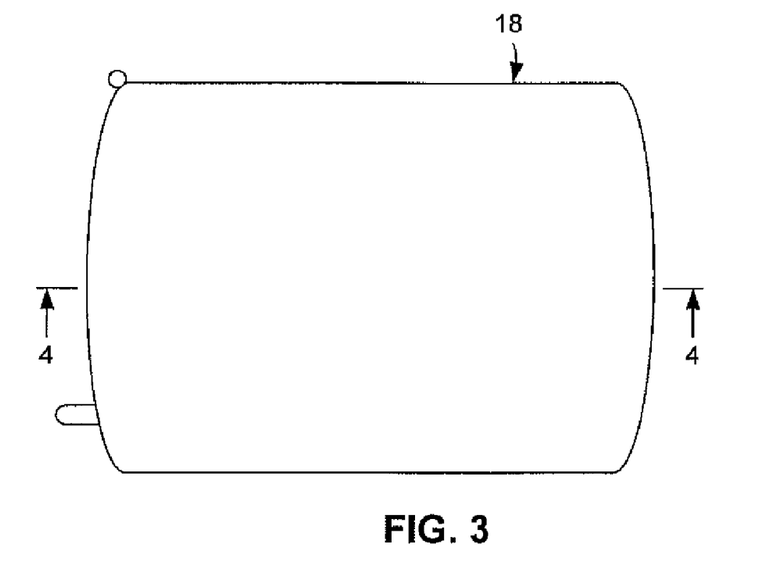
FIG. 3 is a top view of a conventional evaporative coating machine for applying coatings to semiconductor chips.
Figure 4:
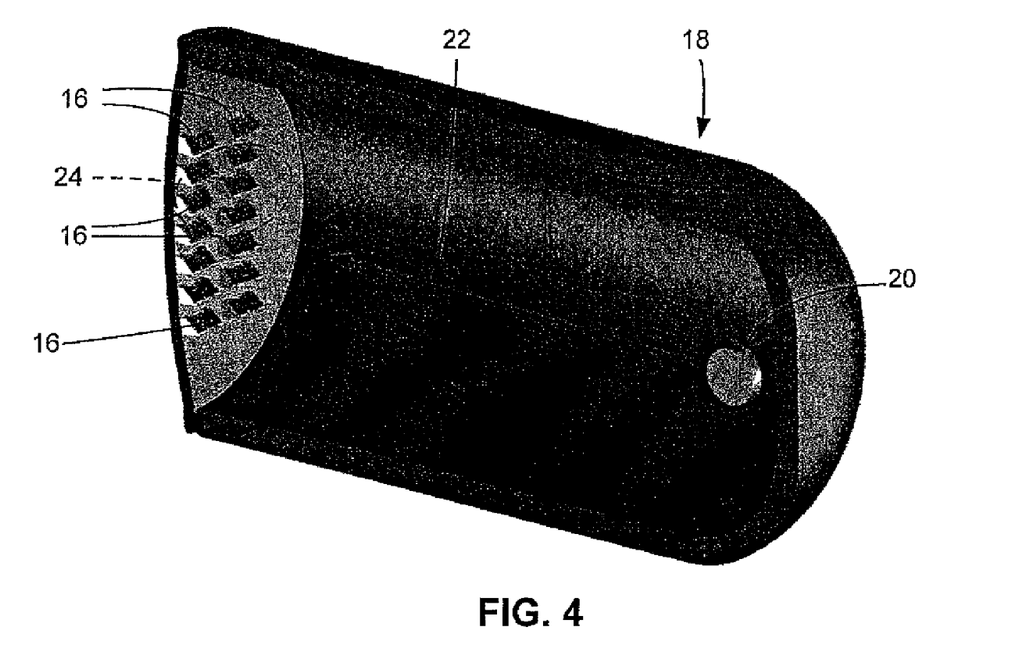
FIG. 4 is a perspective cross-sectional view of the coating machine, taken on line 4-4 of FIG. 3, showing lead frames having laser chips mounted in the machine in accordance with the coating method of the present invention.

As shown in FIGS. 3-4, lead frame array stacks 16 are mounted in an arrayed manner in an evaporative coating machine 18 of a suitable type that is conventionally used for coating semiconductor chips. Note that in machine 18 the coating material that evaporates from a source 20 travels substantially in a direction 22 toward lead frame array stacks 16.

Figure 5:
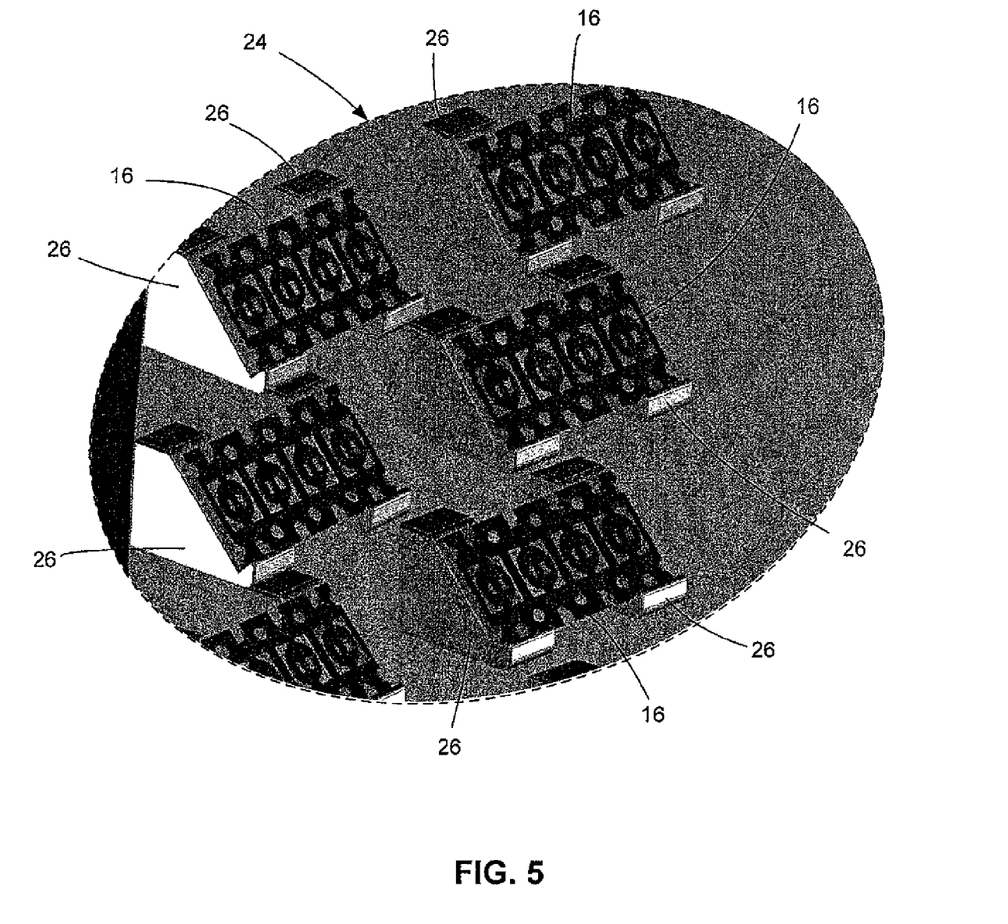
FIG. 5 is a perspective view of an area of the interior of the machine of FIG. 4, enlarged to show the lead frame stacks mounted in the machine.

An area 24 of FIG. 4 is shown enlarged in FIG. 5. In FIG. 5, lead frame array stacks 16 can be seen mounted on angled supports 26 (mounted inside a door of machine 18). As further shown in FIGS. 6-7 and 10, each lead frame array stack 16 comprises a plurality of lead frame arrays 28 stacked upon one another in a spatially offset manner, such that a portion 30 of one lead frame array 28 masks or covers a portion of a chip 10 that is mounted on an adjacent lead frame array 28 in lead frame array stack 16. The masked or covered portion can include, for example, the bond pads (see FIGS. 1-2) or other portions that need to remain free of coating to facilitate further manufacturing steps (such as attaching bond wires) or to allow chip 10 to operate properly. As described in further detail below, the angle at which supports 26 retain lead frame array stacks 16 with respect to coating direction 22 (see FIG. 4) promotes coating only desired portions of chips 10, i.e., the exposed portions, while preventing coating the masked portions, as described below in further detail.

Figure 6:
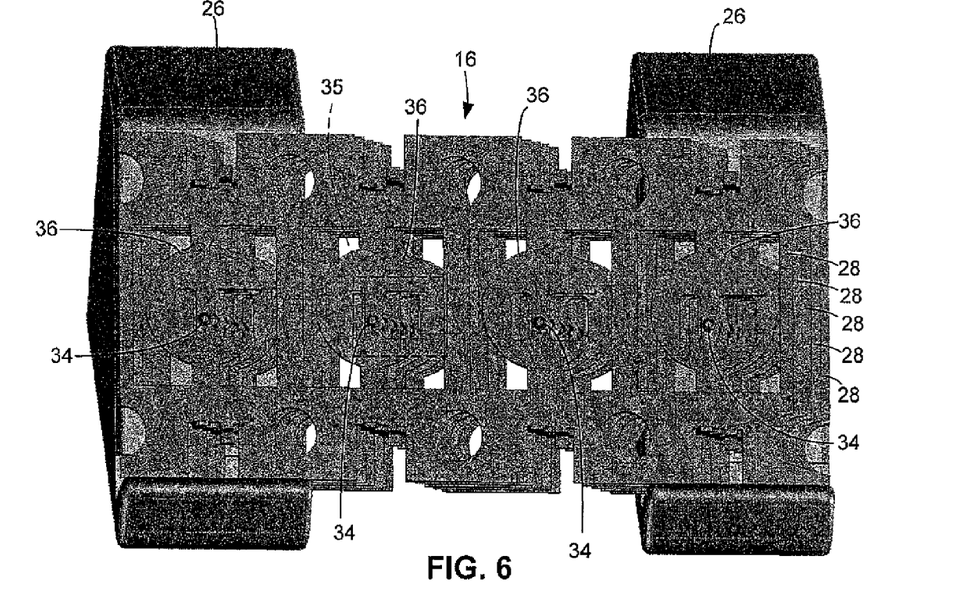
FIG. 6 is a perspective view of one of a plurality of lead frame stacks as mounted in the machine of FIGS. 3-5.
Figure 7:
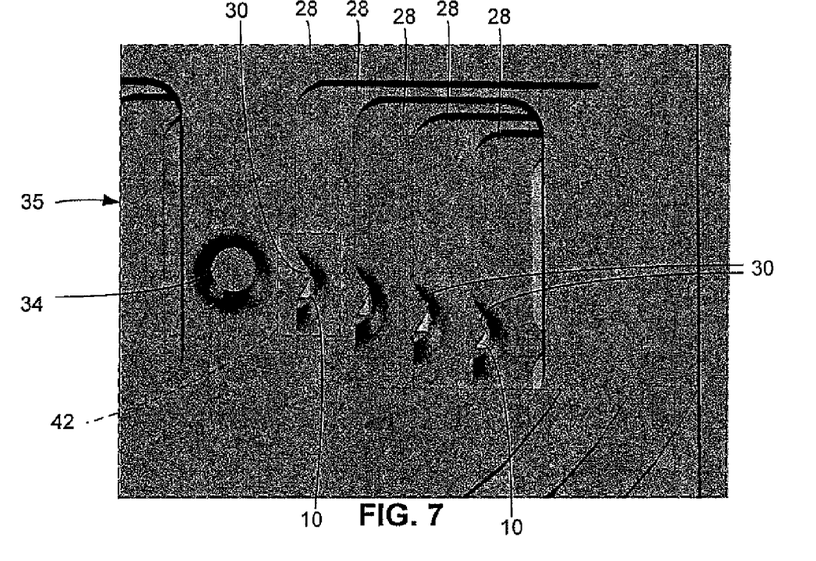
FIG. 7 is an enlargement of an area of FIG. 6.

An area 35 of FIG. 6 is shown enlarged in FIG. 7. Note that although in the illustrated embodiment of the invention each chip 10 is mounted on a pedestal-like protrusion or portion 34 of lead frame array 28, in other embodiments chips 10 can be mounted in any other suitable manner. (In the exemplary embodiment of the invention, the outer lead frame array 28 in lead frame array stack 16 does not have any chips 10 mounted on it, as its function is solely masking.) Each lead frame array stack 16 is shown in FIGS. 6-7 as comprising five stacked lead frame arrays 28 for purposes of illustration, but any suitable number can be stacked. Similarly, although in the illustrated embodiment of the invention each lead frame array 28 has a strip-like shape comprising a linear array of four interconnected lead frames 36, in other embodiments the lead frame arrays can have any other suitable structure and hold any other suitable number of chips.

Figure 8:
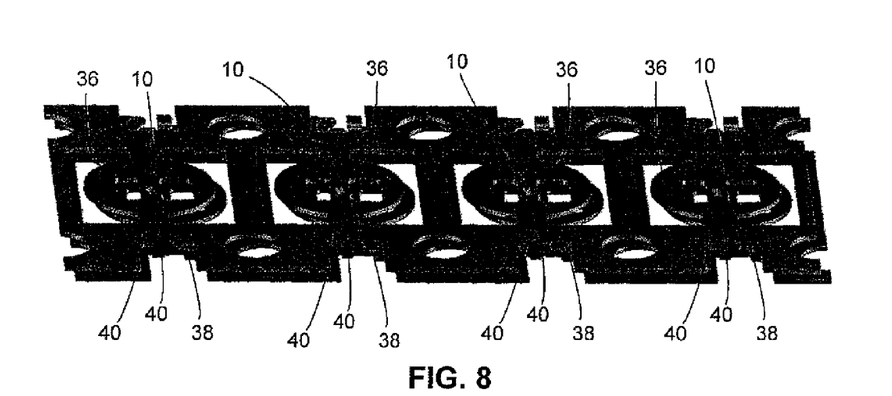
FIG. 8 is a perspective view of two stacked lead frames of FIGS. 6-7.
Figure 9:
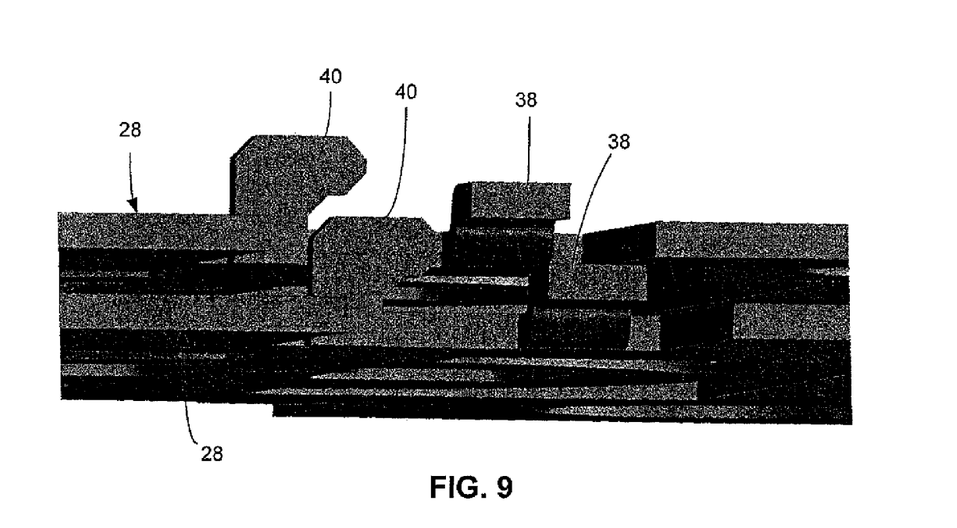
FIG. 9 is a perspective view of the stacked lead frames of FIG. 8, showing the registration features for maintaining them in alignment with each other.

As illustrated in FIGS. 8-9, the portion of each lead frame array 28 that is not used for mounting chips 10 thereon is used to facilitate handling and for registration, i.e., mutual alignment of one lead frame array 28 with an adjacent lead frame array 28 in the stack 16. This registration portion of lead frame array 28 includes horizontal tabs 38 that space or offset the lead frame array 28 from an adjacent lead frame array 28. (Tabs 38 are "horizontal" in that they are substantially parallel to the plane of lead frame array 28, which has a substantially planar shape in the exemplary embodiment.) The registration portion of lead frame array 28 also includes vertical tabs 40 that engage a slot-like space in an adjacent lead frame array 28 to align the two adjacent lead frame arrays 28 in a horizontal direction to fix or set their (horizontal) spatial offset. The slot-like space in the exemplary lead frame array 28 is defined by a front edge of one of the vertical tabs 40 and a rear edge of one of the horizontal tabs 38, as best shown in FIG. 9. The remainder of the registration portion of lead frame array 28 can include any other suitable features, such as holes to facilitate handling or manufacturing in strips or rolls.

Figure 10:
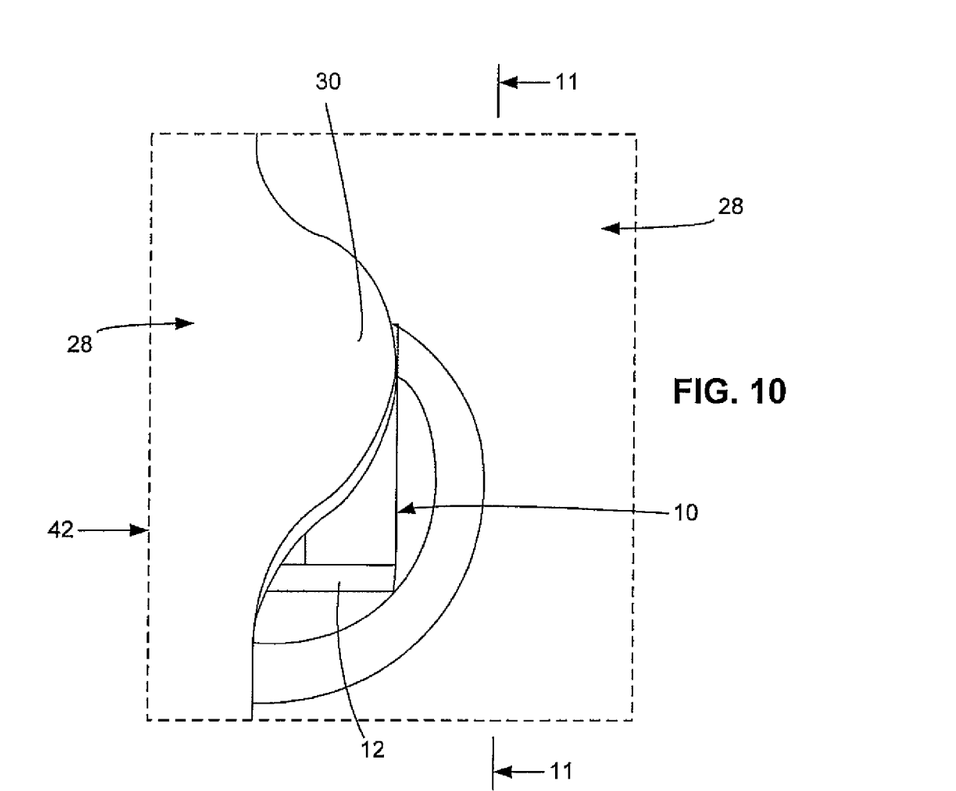
FIG. 10 is an enlargement of an area of FIG. 7.
Figure 11:
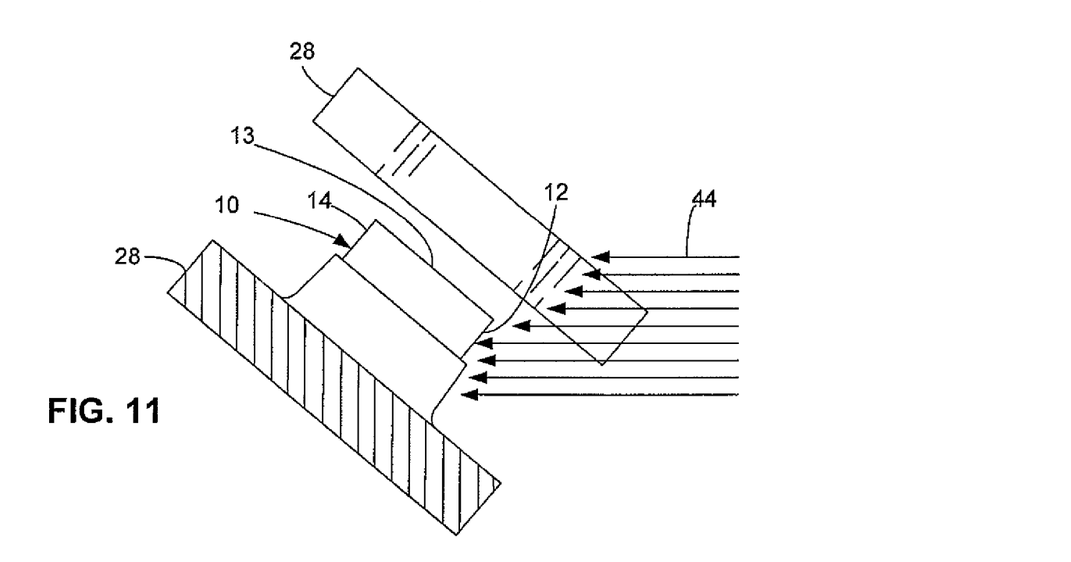
FIG. 11 is a sectional view, taken on line 11-11 of FIG. 10.

An area 42 of FIG. 7 is shown enlarged in FIG. 10, and a sectional view through area 42 is shown in FIG. 11. (The section is taken through only two adjacent lead frame arrays 28 for purposes of clarity.) The flow of coating material 44 in machine 18 (which flows or travels substantially parallel to direction 22 in FIG. 4) reaches facet 12 of chip 10 and bonds to it, i.e., coats it. However, note that bond pad 13 (FIG. 1) is not visible in FIG. 10 because portion 30 of the upper or top lead frame array 28 masks or obscures it. (Direction 22 is normal to the page in FIG. 10.) It is this masking effect that prevents the flow of coating material 44 from reaching bond pad 13 when coating machine 18 (FIG. 1) is operated. Were it not for the masking effect, the flow of coating material 44 would undesirably coat bond pad 13. The oblique angle at which chip 10 is oriented with respect to the flow of coating material 44 causes facet 12 to be exposed but bond pad 13 to be masked.

Figure 12:
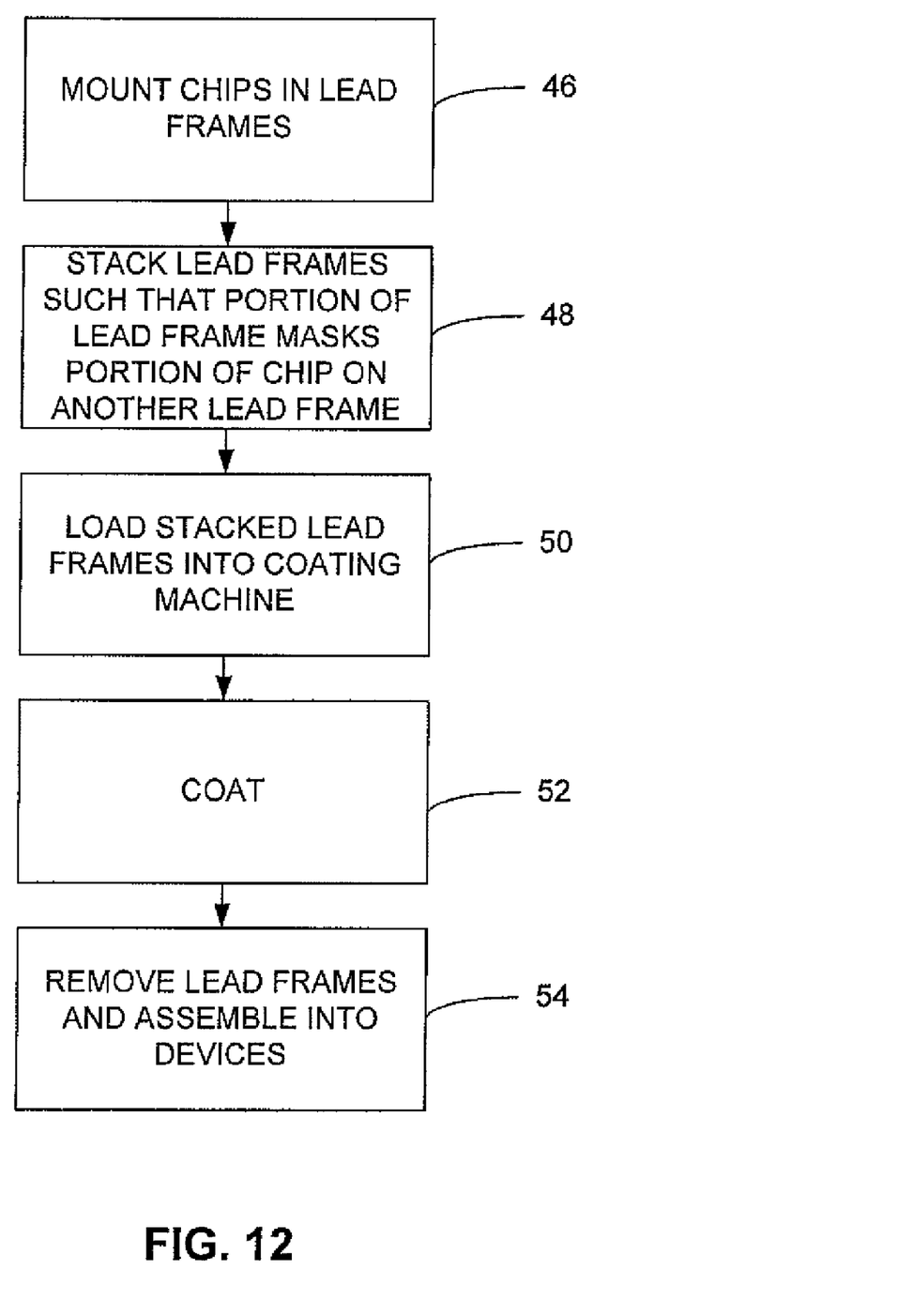
FIG. 12 is a flow diagram, illustrating a method for coating chips in accordance with an exemplary embodiment of the present invention.

An exemplary method is summarized in FIG. 12. At step 46, chips 10 are mounted in lead frames 36 of lead frame arrays 28. At step 48, lead frames 36 (in lead frame arrays 28) are stacked in an orientation with respect to each other to facilitate the above-described masking effect when placed in coating machine 18. At step 50, the lead frame array stacks 16 are mounted in coating machine 18 (FIG. 4). Although in the exemplary embodiment stacks 16 are mounted in the door of machine 18 and arranged in arrays, in other embodiments they can be mounted and arranged in any other suitable manner. At step 52, machine 18 is operated in the conventional manner. The flow of coating material 44 impinges upon the exposed portions of chips 10, thereby coating them, but is blocked from impinging upon the masked portions of chips 10. At step 54, following the coating step, the arrayed stacks 16 are removed from machine 18 and separated. The lead frames 36 on which chips 10 are mounted are separated from the remaining portions of lead frame arrays 28 (which can be discarded). The lead frames 36, which at that time in the process have coated facets 12, can then be assembled into opto-electronic devices. Although only coating facet 12 has been described for purposes of clarity, it should be apparent to persons of skill in the art that facet 14 could similarly be coated by removing, reversing and replacing lead frame arrays 28 and again operating coating machine 18. Indeed, in other embodiments of the invention, lead frames can be provided and oriented that are suitable for coating any desired portions of a semiconductor chip while masking other portions.

Figure 13:
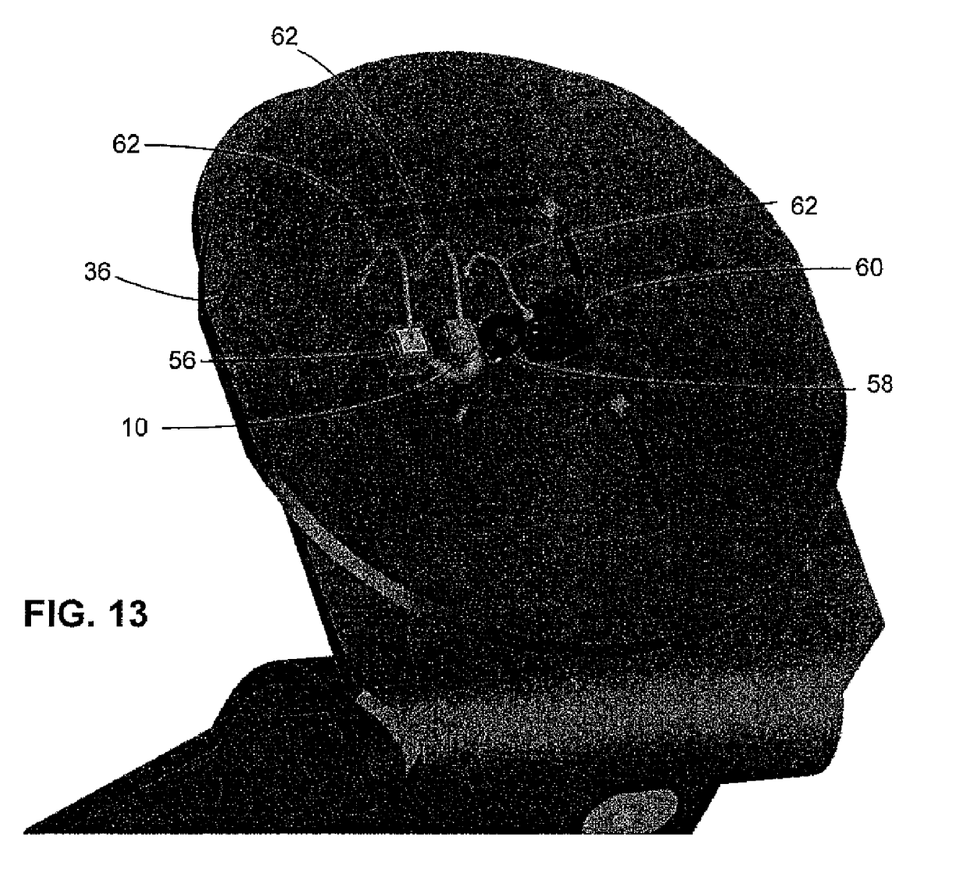
FIG. 13 is a perspective view of a chip and lead frame after being coated, showing the portion of the lead frame on which the chip is mounted having been separated from the remaining portion.
Figure 14:
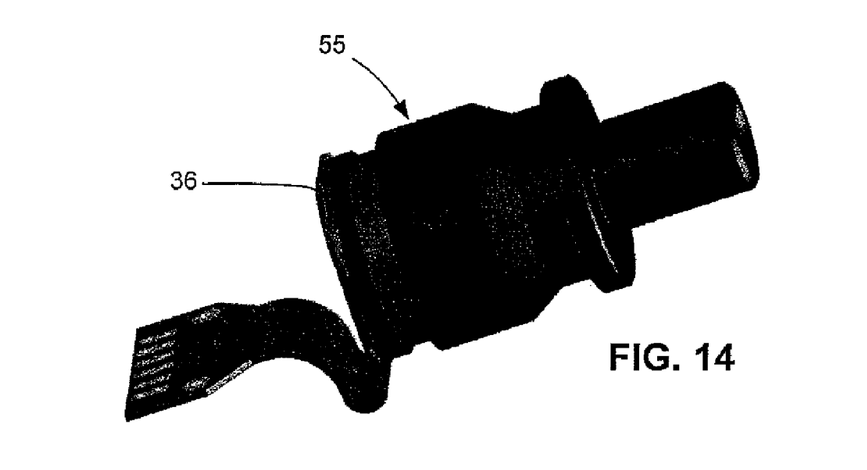
FIG. 14 is a perspective view of an exemplary opto-electronic device having an edge-emitting laser chip with facets coated in accordance with the present invention.

As illustrated in FIGS. 13-14, once a lead frame 36 bearing a chip 10 has been separated, additional (conventional) manufacturing steps can be employed to produce an opto-electronic device 55. The exemplary device 55 shown in FIGS. 13-14 includes not only chip 10 but also a power feedback diode 56, a ball lens 58, and a PIN diode 60 (not visible in FIG. 14), all attached to lead frame 36 and electrically connected by bond wires 62. Note that bond wire 62 can be attached to the bond pad 13 (FIGS. 1-2) of chip 10 in the conventional manner because bond pad 13 is kept free of coating material. Device 55 is intended only as an example of a type of electronic device that can be produced using the present invention, and others will occur readily to persons skilled in the art in view of these teachings. In other such embodiments, the semiconductor chips contained in such devices need not be limited to edge-emitting lasers, the coated portions need not be limited to optical facets, and the masked portions need not be limited to bond pads.

More generally, it should be noted that the invention has been described with reference to one or more illustrative embodiments for the purposes of demonstrating the principles and concepts of the invention and to provide one or more examples of the manner in which the invention may be implemented. The invention is not limited to these embodiments, as will be understood by persons skilled in the art in view of the description provided herein. For example, although in the illustrated embodiment of the invention masking occurs due to the shape of portion 30 of led frame array 28 and the spatial offset among lead frame arrays 28 in lead frame stack 16, in other embodiments other combinations of shapes and orientations can provide the masking. Those skilled in the art will understand that various modifications may be made to the embodiments described herein and that it is intended that the present invention cover all such modifications and variations provided that they come within the scope of any claims and their equivalents. With regard to the claims, no claim is intended to invoke the sixth paragraph of 35 U.S.C. Section 112 unless it includes the term "means for" followed by a participle.

What is claimed is:

1. A method for making semiconductor chips having coated portions, comprising:

mounting each of a plurality of chips in a plurality of lead frames;

stacking the plurality of lead frames in an orientation in which a portion of one lead frame masks a portion of a chip mounted on another lead frame but leaves another portion of the chip mounted on the other lead frame exposed to receive a coating; and depositing a coating on the stacked plurality of lead frames in a coating machine in an orientation in which each chip has a surface to be coated oriented at an oblique angle to a coating application direction, the coating substantially simultaneously reaching each lead frame of the stacked plurality of lead frames, whereby the coating is deposited on exposed portions of chips and is not deposited on masked portions of chips.

2. The method claimed in claim 1, wherein the exposed portions of the chips include edges of edge-emitting laser chips.

3. The method claimed in claim 1, wherein the masked portions of the chips include bond pads.

4. The method claimed in claim 1, wherein the step of stacking the plurality of lead frames comprises stacking the lead frames in a stack direction and spatially offsetting each of a plurality of lead frames from another of the plurality of lead frames in a direction perpendicular to the stack direction.

5. The method claimed in claim 1, wherein:
a plurality of lead frames are mutually connected in a lead frame array, and the step of mounting each of a plurality of chips comprises mounting a chip on each lead frame in the lead frame array.

6. The method claimed in claim 5, wherein the plurality of lead frames are mutually connected in a strip-like linear lead frame array, and the step of mounting each of a plurality of chips comprises mounting a chip on each lead frame in the strip-like linear lead frame array.

7. The method claimed in claim 1, wherein a plurality of lead frames are mutually connected in a lead frame array, and the step of stacking the plurality of lead frames comprises stacking one lead frame array on another lead frame array to define a lead frame array stack.

8. The method claimed in claim 7, wherein each lead frame has a substantially planar shape and wherein:
the step of stacking the plurality of lead frames comprises mounting a lead frame array stack in a coating machine in an orientation with each lead frame lying substantially in a plane oriented at an oblique angle to a coating application direction.

9. The method claimed in claim 7, wherein the step of stacking the plurality of lead frames comprises arraying a plurality of lead frame array stacks.

10. The method claimed in claim 9, wherein:
the step of arraying a plurality of stacks of lead frames comprises mounting the plurality of stacks of lead frames in an array in a coating machine; and
the step of depositing a coating on the stacked plurality of lead frames comprises depositing a coating on the arrayed lead frame array stacks in the coating machine.

11. The method claimed in claim 10, wherein each lead frame includes a mounting portion and a registration portion, the registration portion having at least one feature engageable with a portion of another lead frame to align the stacked lead frames with respect to each other, wherein:
the step of mounting each of a plurality of chips in a plurality of lead frames comprises mounting each chip on a mounting portion of a lead frame; and
the method further comprises the step, following the step of depositing a coating, of separating the mounting portion from the registration portion.

12. A method for making semiconductor chips having coated portions, comprising:
mounting each of a plurality of chips in a plurality of lead frames, wherein a plurality of the lead frames are interconnected to each other to define a lead frame array;
stacking one lead frame array having chips mounted thereon on another lead frame array having chips mounted thereon to define a lead frame array stack, wherein each lead frame is oriented in the lead frame array stack in an orientation in which a portion of each lead frame masks a portion of a chip mounted on another lead frame but leaves another portion of the chip mounted on the other lead frame exposed to receive a coating;
arraying the plurality of lead frame array stacks in a coating machine in an orientation in which each chip has a surface to be coated oriented at an oblique angle to a coating application direction; and
directing a coating material in the coating application direction toward the arrayed lead frame array stacks, whereby the coating is deposited on the surfaces to be coated and is not deposited on masked portions of chips.

13. The method claimed in claim 12, wherein the step of stacking one lead frame array having chips mounted thereon on another lead frame array having chips mounted thereon comprises spatially offsetting each of a plurality of lead frame arrays from another of the plurality of lead frame arrays.

14. The method claimed in claim 12, wherein each lead frame includes a mounting portion and a registration portion, the registration portion having at least one feature engageable with a portion of another lead frame to align the stacked lead frames with respect to each other, wherein:
the step of mounting each of a plurality of chips in a plurality of lead frames comprises mounting each chip on a mounting portion of a lead frame; and
the method further comprises the step, following the step of depositing a coating, of separating the mounting portion from the registration portion.

* * * * *